US009575134B2

(12) United States Patent
Sawayanagi et al.

(10) Patent No.: US 9,575,134 B2
(45) Date of Patent: Feb. 21, 2017

(54) ASSEMBLED-BATTERY VOLTAGE DETECTION DEVICE

(71) Applicants: Tomohiro Sawayanagi, Nagano (JP); Tadasuke Yano, Aichi (JP); Yosuke Kinoshita, Nagano (JP); Yuichi Ikeda, Aichi (JP)

(72) Inventors: Tomohiro Sawayanagi, Nagano (JP); Tadasuke Yano, Aichi (JP); Yosuke Kinoshita, Nagano (JP); Yuichi Ikeda, Aichi (JP)

(73) Assignee: OMRON AUTOMOTIVE ELECTRONICS CO., LTD., Aichi (JP)

( * ) Notice: Subject to any disclaimer, the term of this patent is extended or adjusted under 35 U.S.C. 154(b) by 173 days.

(21) Appl. No.: 14/541,883

(22) Filed: Nov. 14, 2014

(65) Prior Publication Data

US 2015/0137821 A1     May 21, 2015

(30) Foreign Application Priority Data

Nov. 15, 2013   (JP) .................................. 2013-237268

(51) Int. Cl.
  *G01N 27/416*     (2006.01)
  *G01R 31/36*      (2006.01)

(52) U.S. Cl.
  CPC ......... *G01R 31/3658* (2013.01); *G01R 31/362* (2013.01)

(58) Field of Classification Search
  CPC ............ G01R 31/3648; G01R 31/3627; G01R 31/3662; G01R 31/3631; G01R 31/36; G01R 19/0084; Y02E 60/12
  (Continued)

(56) References Cited

U.S. PATENT DOCUMENTS 6,075,344 A     6/2000  Kawai
6,255,803 B1 *  7/2001  Ishihara ............. G01R 31/3658
                                                320/134

(Continued)

FOREIGN PATENT DOCUMENTS

JP       H11-252809 A     9/1999
JP       2005-168118 A    6/2005

(Continued)

*Primary Examiner* — Richard Isla Rodas
*Assistant Examiner* — Mohammed J Sharief
(74) *Attorney, Agent, or Firm* — Osha Liang LLP

(57) ABSTRACT

An assembled-battery voltage detection device for detecting a voltage at an assembled-battery including a plurality of single batteries connected in series includes: single-battery voltage detection circuits detecting voltages at the respective single batteries; single-battery voltage detection terminals connected to ends of the single batteries; connectors connecting the single-battery voltage detection terminals and the single batteries; voltage detection terminals detecting a voltage at one of the single batteries located at one end in the assembled battery; an assembled-battery voltage detection circuit detecting a potential difference between the voltage detection terminals; a single-battery voltage sum calculator calculating a sum of the voltages detected by the single-battery voltage detection circuits; an end-battery voltage abnormality determination unit determining whether the voltage at the single battery located at the end is 0 V; and an abnormality output unit outputting an abnormality depending on predetermined conditions.

1 Claim, 11 Drawing Sheets

(58) Field of Classification Search
USPC .......................................... 320/426; 324/426
See application file for complete search history.

(56) References Cited

U.S. PATENT DOCUMENTS

| | | | |
|---|---|---|---|
| 8,754,654 B2 | 6/2014 | Furukawa | |
| 2011/0050236 A1* | 3/2011 | Sekizaki | G01R 31/3658 324/426 |
| 2011/0148426 A1* | 6/2011 | Yokotani | G01R 19/16542 324/434 |
| 2013/0119941 A1* | 5/2013 | Moorhead | G01R 31/3648 320/136 |
| 2013/0201587 A1* | 8/2013 | Baek | G01R 31/362 361/86 |

FOREIGN PATENT DOCUMENTS

| | | |
|---|---|---|
| JP | 2010-025925 A | 2/2010 |
| JP | 2012-050316 A | 3/2012 |

* cited by examiner

FIG. 1B

| Single battery | Each single-battery voltage measurement result | Assembled-battery voltage measurement result | |
|---|---|---|---|
| n | 3.5V | - | |
| n-1 | 3.5V | - | |
| n-2 | 3.5V | - | |
| . | . | . | |
| . | . | . | |
| 3 | 3.5V | - | |
| 2 | 3.5V | - | |
| 1 | 3.5V | - | Difference |
| | σ= 3.5V * n | δ= 3.5V * n | 0V |

FIG. 2B

| Single battery | Each single-battery voltage measurement result | Assembled-battery voltage measurement result | |
|---|---|---|---|
| n | 0V | - | |
| n-1 | 3.5V | - | |
| n-2 | 3.5V | - | |
| . | . | . | |
| . | . | . | |
| 3 | 3.5V | - | |
| 2 | 3.5V | - | |
| 1 | 3.5V | - | Difference |
| | σ = 3.5V * (n-1) | δ = 3.5V * n | 3.5V |

*FIG. 3B*

| Single battery | Each single-battery voltage measurement result | Assembled-battery voltage measurement result | |
|---|---|---|---|
| n | 3.5V | - | |
| n-1 | 3.5V | - | |
| n-2 | 3.5V | - | |
| . | . | . | |
| . | . | . | |
| 3 | 3.5V | - | |
| 2 | 3.5V | - | |
| 1 | 0V | - | Difference |
| | σ = 3.5V * (n-1) | δ = 3.5V * n | 3.5V |

FIG. 4B

| Single battery | Each single-battery voltage measurement result | Assembled-battery voltage measurement result | |
|---|---|---|---|
| n | 0V | - | |
| n-1 | 3.5V | - | |
| n-2 | 3.5V | - | |
| . | . | . | |
| . | . | . | |
| 3 | 3.5V | - | |
| 2 | 3.5V | - | |
| 1 | 3.5V | - | Difference |
| | σ= 3.5V * (n-1) | δ= 3.5V * (n-1) | 0V |

FIG. 5B

| Single battery | Each single-battery voltage measurement result | Assembled-battery voltage measurement result | |
|---|---|---|---|
| n | 3.5V | - | |
| n-1 | 3.5V | - | |
| n-2 | 3.5V | - | |
| . | . | . | |
| . | . | . | |
| 3 | 3.5V | - | |
| 2 | 3.5V | - | |
| 1 | 0V | - | Difference |
| | σ= 3.5V * (n-1) | δ= 3.5V * (n-1) | 0V |

ASSEMBLED-BATTERY VOLTAGE DETECTION DEVICE

CROSS-REFERENCE TO RELATED APPLICATION

This application is based on Japanese Patent Application No. 2013-237268 filed with the Japan Patent Office on Nov. 15, 2013, the entire contents of which are incorporated herein by reference.

FIELD

The disclosure relates to an assembled-battery voltage detection device that detects a voltage of an assembled battery constructed with a plurality of single batteries (cells) connected in series.

BACKGROUND

Conventionally, there is well known a device or a method for detecting an abnormality of an assembled battery constructed with a plurality of rechargeable single batteries connected in series. For example, Japanese Unexamined Patent Publication No. 11-252809 discloses a battery pack overcharge/overdischarge preventing control device in which a protective circuit makes a self-diagnosis to determine whether a protective circuit of a secondary battery normally operates. The battery pack overcharge/overdischarge preventing control device determines whether the protective circuit normally operates by comparing a total cell voltage, in which cell voltages at a plurality of secondary batteries detected by a cell voltage detection circuit are added to each other, to a battery voltage detected by a battery voltage detection circuit. In control of the battery pack overcharge/overdischarge preventing control device, when a switching circuit is turned off to interrupt a charge or discharge current, whether the protective circuit normally operates is determined based on whether a current value output from a current detection circuit is 0 and whether the battery voltage output from the battery voltage detection circuit is greater than or equal to a voltage necessary for a control circuit to operate.

Japanese Unexamined Patent Publication No. 2005-168118 discloses an assembled-battery abnormality detection device that detects a disconnection between a cell and a detection terminal even if the cell is in the overcharge or overdischarge state. In the assembled-battery abnormality detection device, a circuit that detects the overcharge and overdischarge of the cell outputs a disconnection diagnosis making signal, whereby MOS transistors each provided to a corresponding cell are alternately turned on and off forcedly and the turned-on/off MOS transistors are switched and alternately turned on and off. The assembled-battery abnormality detection device detects the disconnection of a connection line between the cell and the corresponding detection terminal based on a signal detected from an abnormality detection circuit at that time.

Japanese Unexamined Patent Publication No. 2010-025925 discloses an assembled-battery voltage detection device that prevents the false determination that the disconnection is generated although the disconnection is not generated in wiring to an assembled battery. In the assembled-battery voltage detection device, a voltage detection line is extracted from each of a plurality of voltage input terminals, a capacitor is interposed in each coupling line coupling two voltage detection lines adjacent to each other, and each voltage detection line is connected to a voltage detection unit. In the assembled-battery voltage detection device, the voltage detection line located on a positive electrode side of each cell is connected to a ground through one or a plurality of disconnection detecting resistors, and the disconnection of the wiring between a plurality of voltage detection points and a plurality of voltage input terminals of the assembled battery is detected based on an input voltage from each voltage detection line. In the assembled-battery voltage detection device, in the case that the disconnection is generated in a wire harness at the end of the assembled battery, because the voltages at both the ends of the corresponding capacitor substantially are 0, the determination that the disconnection is generated in the wire harness at the end can be made when the voltage at both the ends lowers to a predetermined threshold.

Japanese Unexamined Patent Publication No. 2012-050316 discloses a power supply device that detects disconnections of all the voltage detection lines and surely detects the voltage at the battery cell. The power supply device includes a battery block that is constructed with a plurality of battery cells connected in series, a voltage detection circuit that detects the voltage at each battery cell through the voltage detection line, and a disconnection detection circuit that detects the disconnection of the voltage detection line from a detected voltage of the voltage detection circuit. The disconnection detection circuit determines the disconnection of the voltage detection line if the detected voltage at the battery cell is smaller than a predetermined voltage value or if a voltage difference between the detected voltage value at the battery cell and a predetermined voltage value is larger than a set value.

SUMMARY

One or more embodiments of the disclosure provide an assembled-battery voltage detection device that, in an assembled battery constructed with a plurality of single batteries connected in series, detects a disconnection of a voltage detection line at each of both the ends of the assembled battery and a short circuit of the single battery while distinguishing the disconnection and the short circuit from each other.

An assembled-battery voltage detection device according to one or more embodiments of the disclosure includes: a plurality of single-battery voltage detection circuits configured to detect a voltage at each single battery of an assembled battery in which a plurality of single batteries are connected in series; single-battery voltage detection terminals that are provided in the single-battery voltage detection circuits and connected to ends of the single batteries; connectors configured to connect the single-battery voltage detection terminals and the single batteries; a first voltage detection terminal configured to detect a voltage at one of the single batteries located at end in the assembled battery through a connector again; a second voltage detection terminal configured to detect a voltage at another one of the single batteries located at another end in the assembled battery through a connector again; an assembled-battery voltage detection circuit configured to detect a potential difference between the first voltage detection terminal and the second voltage detection terminal; a single-battery voltage sum calculator configured to calculate a sum of the voltages detected by the plurality of single-battery voltage detection circuits; an end-battery voltage abnormality determination unit configured to determine whether the voltage at the single battery located at the end in the voltages at the single batteries detected by the plurality of single-battery voltage detection circuits is 0 V; and an abnormality output unit configured to, when the end-battery voltage abnormality determination unit determines that the voltage at the single battery located at the end is 0, output an disconnection abnormality when the voltage sum calculated by the single-battery voltage sum calculator does not agree with the potential difference detected by the assembled-battery voltage detection circuit, and output an short-circuit abnormality when the voltage sum agrees with the potential difference.

Accordingly, one or more embodiments of the disclosure can provide the assembled-battery voltage detection device that, in the assembled battery constructed with the plurality of single batteries connected in series, detects the disconnection of the voltage detection line at each of both the ends of the assembled battery and the short circuit of the single battery while distinguishing the disconnection and the short circuit from each other.

BRIEF DESCRIPTION OF THE DRAWINGS

FIG. 1B is a diagram illustrating a battery voltage measurement result, an assembled-battery voltage measurement result, and a difference between the results during the normal operation;

FIG. 2B is a diagram illustrating the battery voltage measurement result, the assembled-battery voltage measurement result, and the difference between the results when the terminal portion disconnects in the highest-order voltage detection line;

FIG. 3B is a diagram illustrating the battery voltage measurement result, the assembled-battery voltage measurement result, and the difference between the results when the terminal portion disconnects in the lowest-order voltage detection line;

FIG. 4B is a diagram illustrating the battery voltage measurement result, the assembled-battery voltage measurement result, and the difference between the results when the short circuit is generated in the highest-order single battery;

FIG. 5B is a diagram illustrating the battery voltage measurement result, the assembled-battery voltage measurement result, and the difference between the results when the short circuit is generated in the lowest-order single battery.

DETAILED DESCRIPTION

Embodiments of the disclosure will be described with reference to the drawings. In embodiments of the disclosure, numerous specific details are set forth in order to provide a more through understanding of the invention. However, it will be apparent to one of ordinary skill in the art that the invention may be practiced without these specific details. In other instances, well-known features have not been described in detail to avoid obscuring the invention.

Embodiments

Figure 1A:
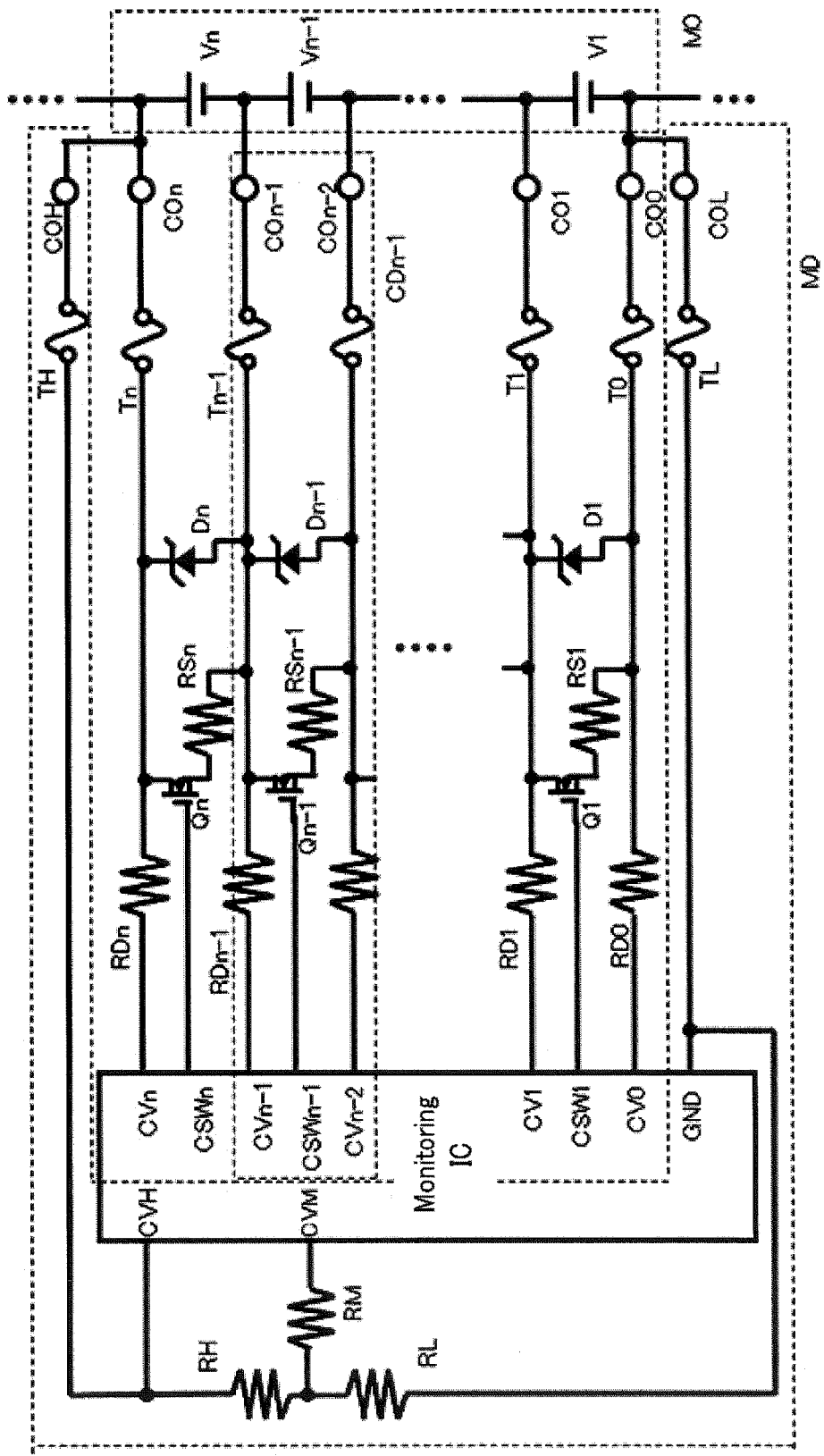
FIG. 1A is a circuit configuration diagram (normal operation state) illustrating an assembled-battery voltage detection device according to one or more embodiments of the disclosure.

FIG. 1A is a circuit configuration diagram of an assembled-battery voltage detection device according to one or more embodiments of the disclosure. An assembled battery MO is formed by connecting n rechargeable single batteries V1 to Vn in series, where n is an integer of 2 or more. The assembled-battery voltage detection device includes n single-battery voltage detection circuits CD1 to CDn that detect voltages at single batteries V1 to Vn and one assembled-battery voltage detection circuit MD that detects a voltage at the assembled battery MO. For the sake of convenience, only the single-battery voltage detection circuit CDn-1 is illustrated in FIG. 1A.

The single-battery voltage detection circuits CD1 to CDn include single-battery voltage detection terminals T0 to Tn that are connected to ends of the single batteries V1 to Vn, connectors CO0 to COn that connect the single-battery voltage detection terminals T0 to Tn and the single batteries V1 to Vn, a monitoring IC that includes various circuits therein, and voltage detection lines that connect the monitoring IC and the single-battery voltage detection terminals T0 to Tn. The single-battery voltage detection terminals T0 to Tn are connected to positive electrodes and negative electrodes of the single batteries V1 to Vn in order to detect the voltages at the single batteries V1 to Vn. The connectors CO0 to COn are connection points of the single-battery voltage detection terminals T0 to Tn and the positive electrodes and negative electrodes of the single batteries V1 to Vn. For example, the single-battery voltage detection terminal Tn-1 is connected to the positive electrode of the single battery Vn-1 and the negative electrode of the single battery Vn.

The single-battery voltage detection circuits CD1 to CDn further include constant-voltage diodes D1 to Dn that correspond to the single batteries V1 to Vn. Cathodes of the constant-voltage diodes D1 to Dn are connected to voltage detection lines connected onto the single batteries having higher potentials, and anodes are connected to voltage detection lines connected onto the single batteries having lower potentials. The single battery supplies the stable voltage to each of the constant-voltage diodes D1 to Dn even if, for example, switching occurs for the purpose of the voltage detection.

The single-battery voltage detection circuits CD1 to CDn further include N-type MOS transistors Q1 to Qn that correspond to the single batteries V1 to Vn. Drains of the N-type MOS transistors Q1 to Qn are connected to the voltage detection lines connected onto the single batteries having the higher potentials, and sources are connected to the voltage detection lines connected onto the single batteries having the lower potentials through resistors RS1 to RSn. Gates of the N-type MOS transistors Q1 to Qn are connected to switching control terminals CSW1 to CSWn of the monitoring IC. The drains N-type MOS transistors Q1 to Qn are connected to voltage input terminals CV1 to CVn of the monitoring IC through resistors RD1 to RDn.

The N-type MOS transistors Q1 to Qn become conductive when the monitoring IC controls the switching control terminals CSW1 to CSWn to put the gates of the N-type MOS transistors Q1 to Qn into an on state. When the N-type MOS transistors Q1 to Qn become conductive, the single-battery voltage detection circuits CD1 to CDn can detect the voltages at the single batteries V1 to Vn as differences between the voltage input terminals CVn and CVn-1 through the resistors RS1 to RSn and resistors RD1 to RDn.

The assembled-battery voltage detection circuit MD includes a first voltage detection terminal TH that is connected to the positive electrode of the highest-order single battery Vn constituting one end of the assembled battery MO and a connector COH that connects the first voltage detection terminal TH and the positive electrode of the single battery Vn. The connector COH is connected between the connector COn of the single-battery voltage detection circuit CDn and the positive electrode of the single battery Vn. Therefore, the assembled-battery voltage detection circuit MD can surely detect the highest-order voltage at the assembled battery although the connector disconnects easily.

The assembled-battery voltage detection circuit MD includes a second voltage detection terminal TL that is connected to the negative electrode of the lowest-order single battery V1 constituting the other end of the assembled battery MO and a connector COL that connects the second voltage detection terminal TL and the negative electrode of the single battery V1. The connector COL is connected between the connector CO0 of the single-battery voltage detection circuit CD1 and the negative electrode of the single battery V1. Therefore, the assembled-battery voltage detection circuit MD can surely detect the lowest-order voltage at the assembled battery although the connector disconnects easily.

In the assembled-battery voltage detection circuit MD, the voltage detection line connected to the first voltage detection terminal TH detecting the highest-order potential is connected to a highest-order voltage input terminal CVH of the monitoring IC, and the voltage detection line connected to the second voltage detection terminal TL detecting the lowest-order potential is connected to a ground GND of the monitoring IC. The voltage detection line connected to the first voltage detection terminal TH is connected to an assembled battery voltage input terminal CVM through resistors RH and RM, and the voltage detection line connected to the second voltage detection terminal TL is connected to the assembled battery voltage input terminal CVM through resistors RL and RM. At the assembled battery voltage input terminal CVM, the voltage at the assembled battery MO can be detected as a potential difference δ between the voltage detected at the first voltage detection terminal TH and the voltage detected at the second voltage detection terminal TL.

In addition to the single-battery voltage detection terminal Tn, the assembled-battery voltage detection circuit MD includes the first voltage detection terminal TH in order to detect the voltage at the single battery Vn located in the highest-order position. Therefore, the voltage at the single battery Vn located in the highest-order position can be detected through the connector COH again. In the single-battery voltage detection circuit CDn, the voltage at the single battery Vn is measured as the difference between the voltage input terminals CVn and CVn-1. On the other hand, in the assembled-battery voltage detection device, the monitoring IC can measure the voltage at the single battery Vn as the difference between the highest-order voltage input terminal CVH and the voltage input terminal CVn-1.

Similarly, in addition to the single-battery voltage detection terminal T0, the assembled-battery voltage detection circuit MD includes the second voltage detection terminal TL in order to detect the voltage at the single battery V1 located in the lowest-order position. Therefore, the voltage at the single battery V1 located in the lowest-order position can be detected through the connector COL again. In the single-battery voltage detection circuit CD1, the voltage at the single battery V1 is measured as the difference between the voltage input terminals CV1 and CV0. On the other hand, in the assembled-battery voltage detection device, the monitoring IC can measure the voltage at the single battery V1 as the difference between the voltage input terminal CV1 and the ground GND.

The monitoring IC includes a single battery voltage sum calculator (not illustrated) that calculates a sum σ of the voltages detected by the single-battery voltage detection circuits CD1 to CDn. In the monitoring IC, the single battery voltage sum calculator includes a circuit that performs the sum of the differences between the voltage input terminals CVn and CVn-1 measured as the voltages at the single batteries V1 to Vn.

The monitoring IC includes an end-battery voltage abnormality determination unit (not illustrated) that determines whether the voltages at the single batteries Vn and V1 located in the highest-order and lower posit positions constituting the ends of the assembled battery MO are 0 in the voltages at the single batteries V1 to Vn detected by the plurality of single-battery voltage detection circuits CD1 to CDn. In the monitoring IC, the end-battery voltage abnormality determination unit includes a circuit that determines whether the difference between the voltage input terminals CVn and CVn-1, which is of the voltage at the single battery Vn, is 0 and a circuit that determines whether the difference between the voltage input terminals CV0 and CV1, which is of the voltage at the single battery V1, is 0.

The monitoring IC includes an abnormality output unit (not illustrated). When the end-battery voltage abnormality determination unit determines that the voltages at the highest-order and lowest-order single batteries Vn and V1 located at the ends are 0, the abnormality output unit determines that a disconnection abnormality is generated and outputs information that the disconnection abnormality is generated when the voltage sum σ calculated by the single battery voltage sum calculator does not agree with the potential difference δ detected by the assembled-battery voltage detection circuit MD, and the abnormality output unit determines that a short-circuit abnormality is generated and outputs information that the short-circuit abnormality is generated when the voltage sum σ calculated by the single battery voltage sum calculator agrees with the potential difference δ detected by the assembled-battery voltage detection circuit MD. In the monitoring IC, the abnormality output unit includes a circuit that compares the voltage sum σ calculated by the single battery voltage sum calculator to the potential difference δ detected by the assembled-battery voltage detection circuit MD and outputs a signal indicating the disconnection abnormality or the short-circuit abnormality according to the comparison result.

FIG. 1B is a diagram illustrating a single battery voltage measurement result, an assembled-battery voltage measurement result, and a difference between the results during a normal operation in which the disconnection or short-circuit abnormality is not generated in one or more embodiments of the disclosure. It is assumed that each single battery outputs the voltage of 3.5 V during the normal operation. Each of the single-battery voltage detection circuits CD1 to CDn detects the voltage of 3.5 V. The single battery voltage sum calculator calculates the sum σ of the n single batteries V1 to Vn as 3.5 V*n. For example, the sum σ is 56 V for 16 (n=16)

single batteries. The assembled-battery voltage detection circuit MD detects 3.5 V*n because the n single batteries are connected in series. Similarly, the potential difference δ, namely, the voltage of the assembled battery is 56 V for the 16 single batteries. During the normal operation, the highest-order and lowest-order single batteries Vn and V1 exhibit the voltage of 3.5 V as a normal value, the sum σ is equal to the potential difference δ, and the difference between the sum σ and the potential difference δ is 0 V.

Figure 2A:
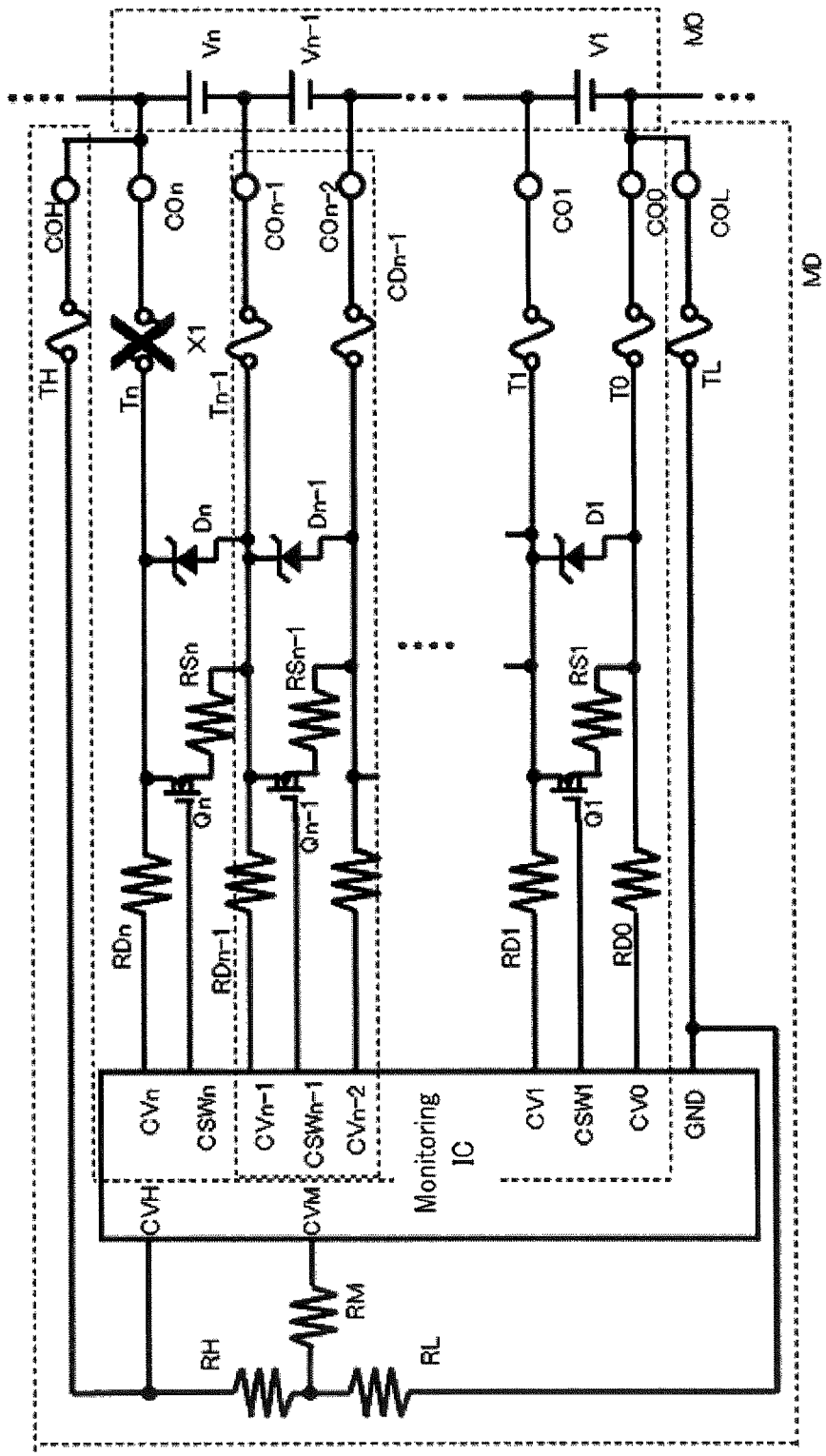
FIG. 2A is a circuit configuration diagram illustrating a state in which a terminal portion disconnects in a highest-order voltage detection line.

FIG. 2A illustrates a state in which the single-battery voltage detection terminal Tn disconnects in the highest-order voltage detection line (portion X1). In this case, although each of the single-battery voltage detection circuits CD1 to CDn-1 detects the voltage of 3.5 V, the single-battery voltage detection circuit CDn cannot detect the difference between the voltage input terminals CVn and CVn-1. Therefore, the difference between the voltage input terminals CVn and CVn-1 is 0 V. On the other hand, the assembled-battery voltage detection circuit MD detects 3.5 V*n similarly to the case in the normal operation because the potential difference δ between the voltage detected by the first voltage detection terminal TH and the voltage detected by the second voltage detection terminal TL is not affected by the disconnection in the portion X1.

FIG. 2B illustrates the measurement results when the single-battery voltage detection terminal Tn disconnects. Because the measurement result is 0 V at the single battery Vn, the sum σ of the voltages at the single batteries V1 to Vn exhibits 3.5 V*(n−1). On the other hand, because the potential difference δ exhibits 3.5 V*n, the difference with the sum σ of the voltages is 3.5 V. Thus, in the case that the single-battery voltage detection terminal Tn disconnects in the highest-order voltage detection line, the detected voltage at the highest-order single battery is 0 V, but the sum σ of the detected voltages at the single batteries does not agree with the detected voltage (potential difference δ) at the assembled battery MO.

Figure 3A:
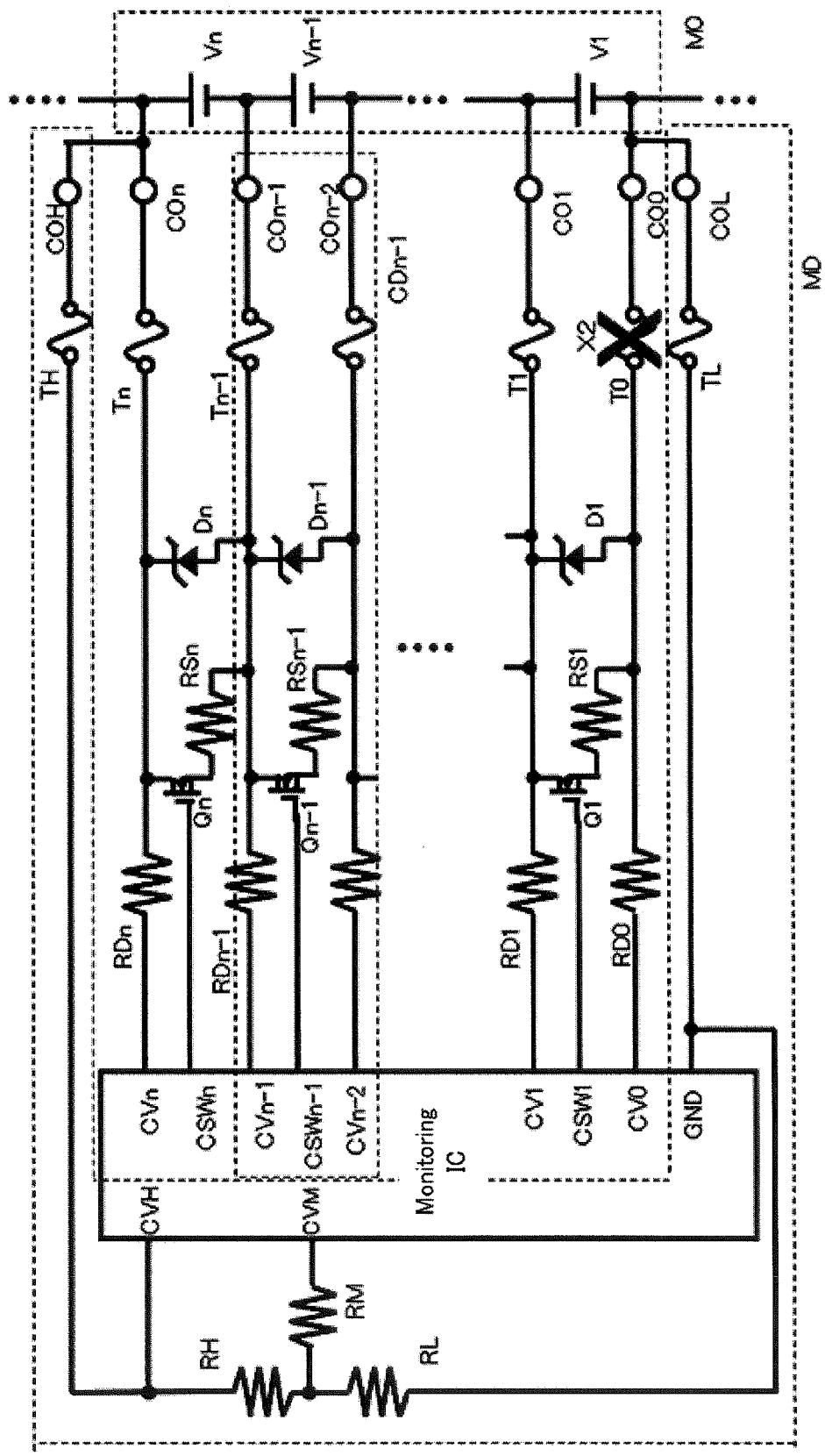
FIG. 3A is a circuit configuration diagram illustrating a state in which a terminal portion disconnects in a lowest-order voltage detection line.

FIG. 3A illustrates a state in which the single battery voltage detection terminal T0 disconnects in the lowest-order voltage detection line (portion X2). In this case, although each of the single-battery voltage detection circuits CD2 to CDn detects the voltage of 3.5 V, the single-battery voltage detection circuit CD1 cannot detect the difference between the voltage input terminals CV1 and CV0. Therefore, the difference between the voltage input terminals CV1 and CV0 is 0 V. On the other hand, the assembled-battery voltage detection circuit MD detects 3.5 V*n similarly to the case in the normal operation because the potential difference δ between the voltage detected by the first voltage detection terminal TH and the voltage detected by the second voltage detection terminal TL is not affected by the disconnection in the portion X2.

FIG. 3B illustrates the measurement results when the single-battery voltage detection terminal T0 disconnects. Because the measurement result is 0 V at the single battery V1, the sum σ of the voltages at the single batteries V1 to Vn exhibits 3.5 V*(n−1). On the other hand, because the potential difference δ exhibits 3.5 V*n, the difference with the sum σ of the voltages is 3.5 V. Thus, in the case that the single-battery voltage detection terminal T0 disconnects in the lowest-order voltage detection line, the detected voltage at the lowest-order single battery is 0 V, but the sum σ of the detected voltages at the single batteries does not agree with the detected voltage (potential difference δ) at the assembled battery MO.

Figure 4A:
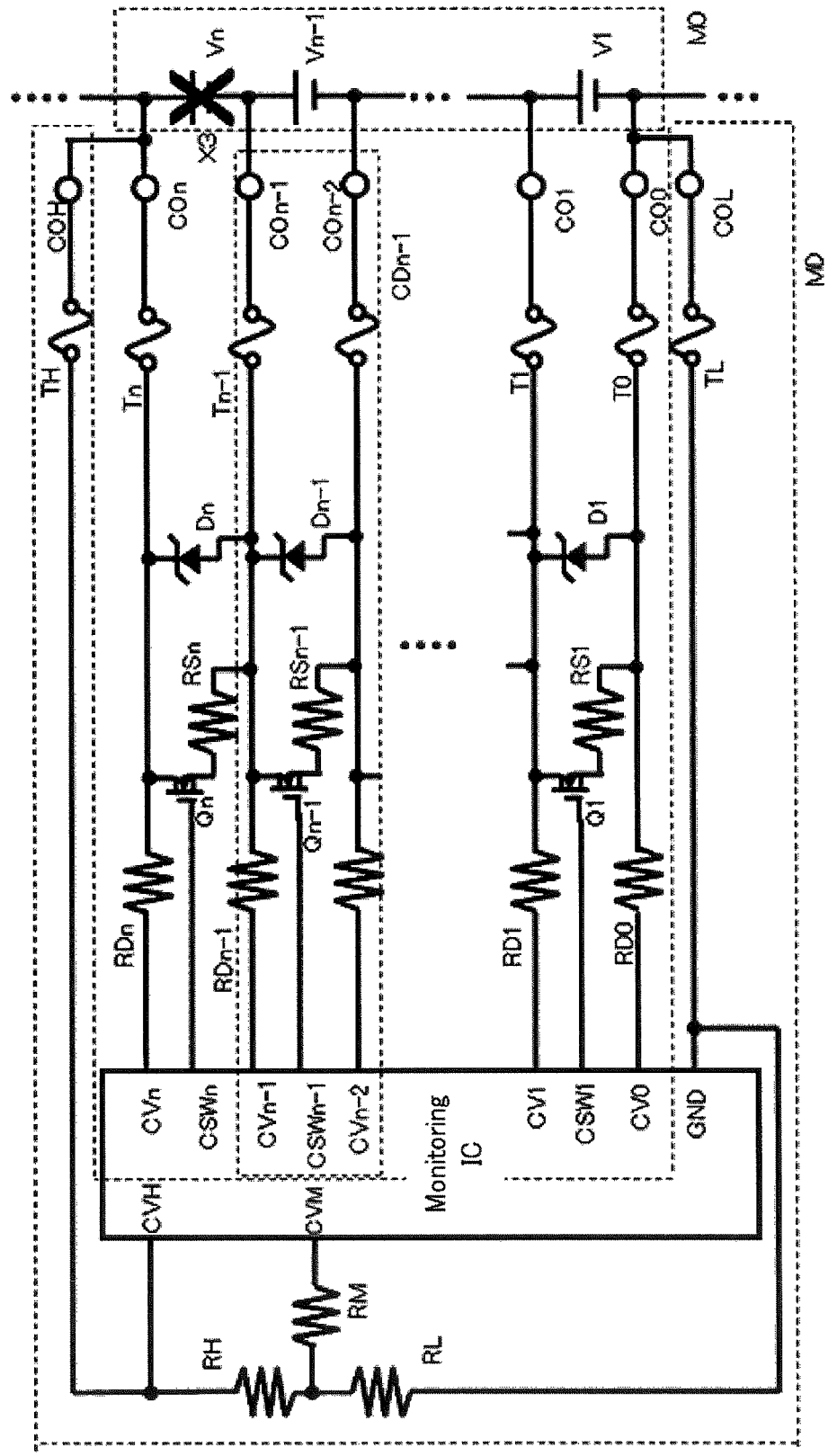
FIG. 4A is a circuit configuration diagram illustrating a state in which a short circuit is generated in a highest-order single battery.

FIG. 4A illustrates a state in which the highest-order single battery Vn short-circuits (portion X3). In this case, although each of the single-battery voltage detection circuits CD1 to CDn-1 detects the voltage of 3.5 V, there is no potential difference as a difference between the voltage input terminals CVn and CVn-1 and the single-battery voltage detection circuit CDn detects 0 V because the single battery Vn short-circuits. On the other hand, because it is similar to the case where the (n−1) single batteries are connected in series, the assembled-battery voltage detection circuit MD detects 3.5 V*(n−1) as the potential difference δ between the voltage detected by the first voltage detection terminal TH and the voltage detected by the second voltage detection terminal TL.

FIG. 4B illustrates the measurement results when the single battery Vn short-circuits. The measurement result is 0 V at the single battery Vn, and the sum σ of the voltages at the single batteries V1 to Vn exhibits 3.5 V*(n−1). On the other hand, the potential difference δ as the voltage at the assembled battery is 3.5 V*(n−1). Accordingly, the difference between the sum σ of voltages at the single batteries V1 to Vn and the voltage at the assembled battery is 0 V. Thus, in the case that the highest-order single battery Vn short-circuits, the detected voltage at the highest-order single battery is 0 V, and the sum σ of the detected voltages at the single batteries agrees with the detected voltage (potential difference δ) at the assembled battery MO.

Figure 5A:
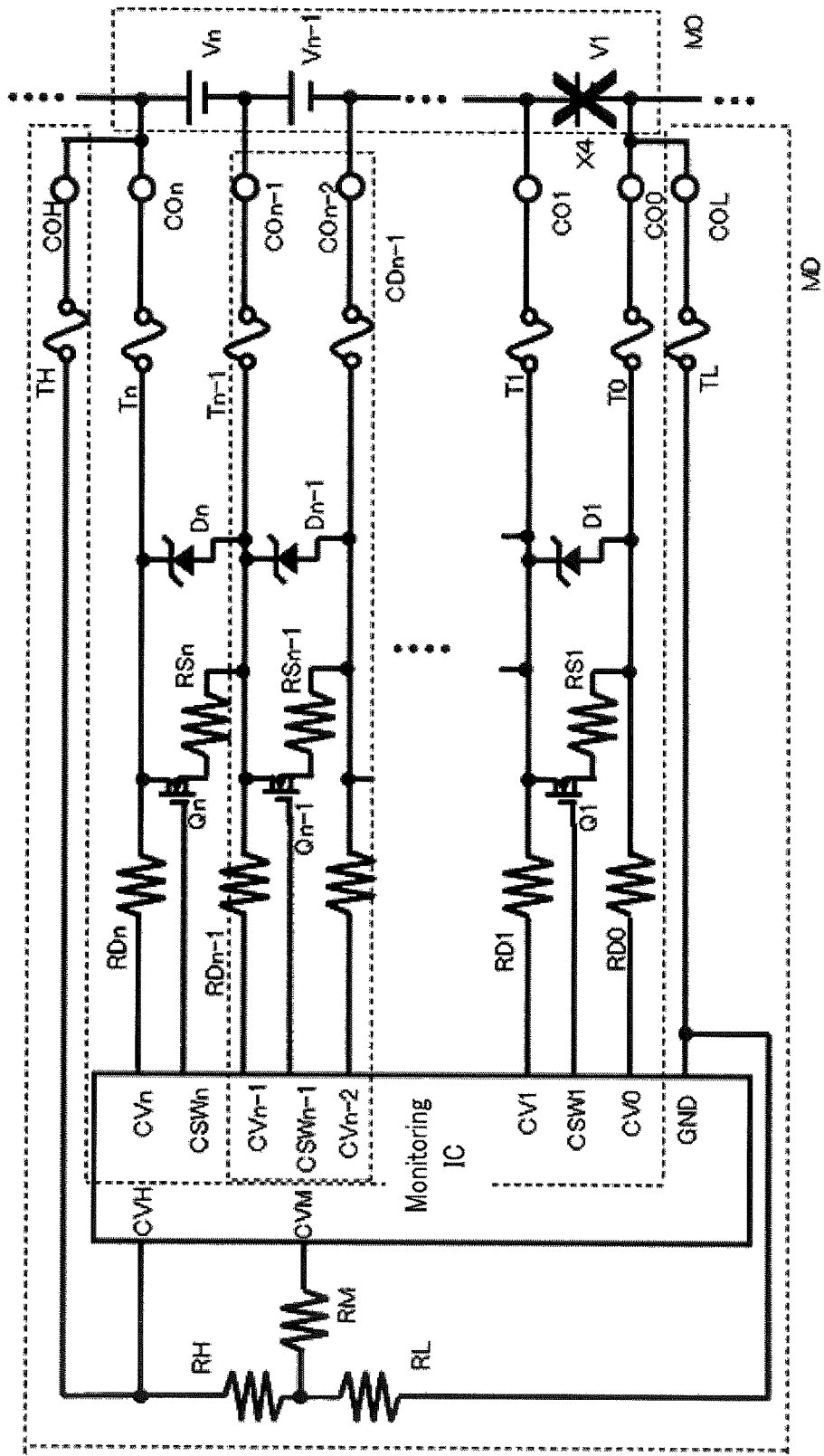
FIG. 5A is a circuit configuration diagram illustrating a state in which a short circuit is generated in a lowest-order single battery.

FIG. 5A illustrates a state in which the lowest-order single battery V1 short-circuits (portion X4). In this case, although each of the single-battery voltage detection circuits CD2 to CDn detects the voltage of 3.5 V, there is no potential difference as a difference between the voltage input terminals CV1 and CV0 and the single-battery voltage detection circuit CD1 detects 0 V because the single battery V1 short-circuits. On the other hand, because it is similar to the case where the (n−1) single batteries are connected in series, the assembled-battery voltage detection circuit MD detects 3.5 V*(n−1) as the potential difference δ between the voltage detected by the first voltage detection terminal TH and the voltage detected by the second voltage detection terminal TL.

FIG. 5B illustrates the measurement results when the single battery V1 short-circuits. Because the measurement result is 0 V at the single battery V1, the sum σ of the voltages at the single batteries V1 to Vn is 3.5 V*(n−1). On the other hand, the potential difference δ as the voltage at the assembled battery is 3.5 V*(n−1). Accordingly, the difference between the sum σ of voltages at the single batteries V1 to Vn and the voltage at the assembled battery is 0 V. Thus, in the case that the lowest-order single battery V1 short-circuits, the detected voltage at the lowest-order single battery is 0 V, and the sum σ of the detected voltages at the single batteries agrees with the detected voltage (potential difference δ) at the assembled battery MO.

Figure 6:
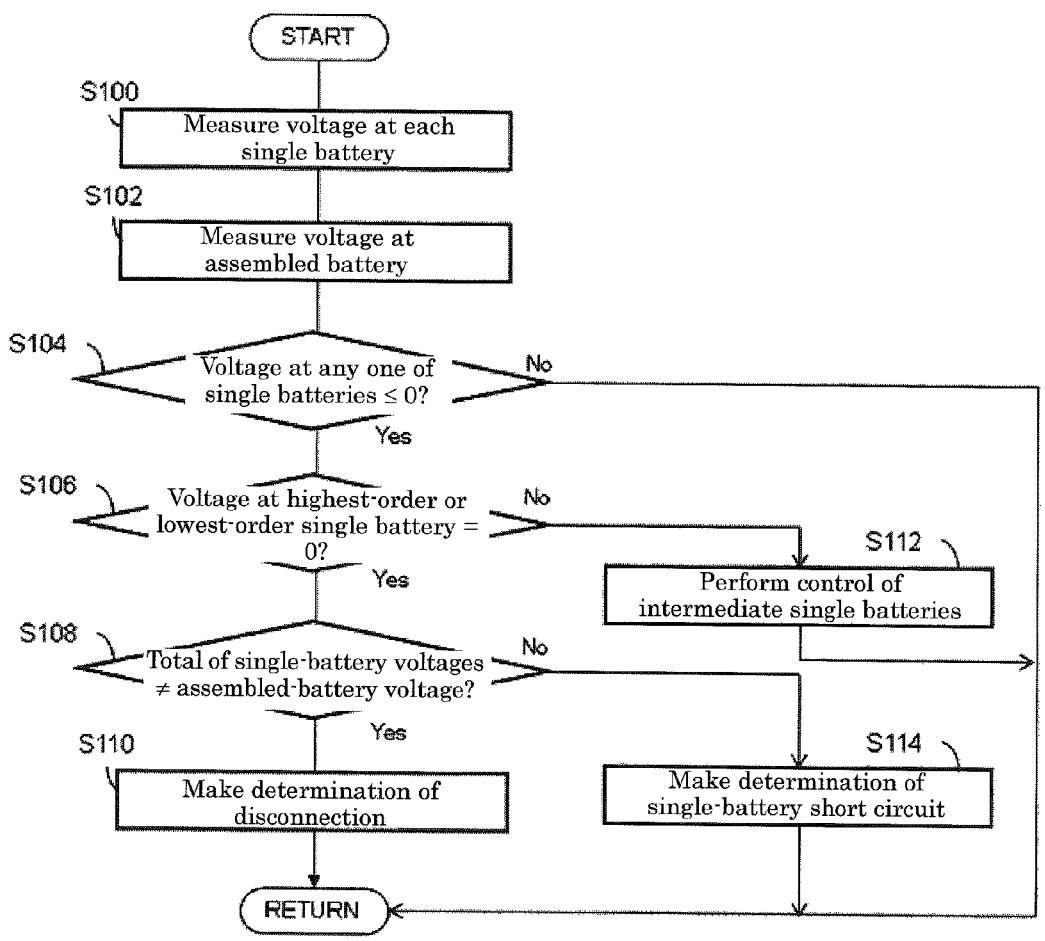
FIG. 6 is a flowchart illustrating a step of controlling the assembled-battery voltage detection device according to one or more embodiments of the disclosure.

A step of controlling the assembled-battery voltage detection device will be described in detail with reference to FIG. 6. Each step is abbreviated to S in a flowchart. In S100, the monitoring IC puts the N-type MOS transistors Q1 to Qn into the conduction states, whereby the single-battery voltage detection circuits CD1 to CDn of the assembled-battery voltage detection device measure the voltages at the single batteries V1 to Vn. In S102, the assembled-battery voltage detection circuit MD of the assembled-battery voltage detection device measures the voltage (potential difference δ) of the assembled battery at the assembled-battery voltage input terminal CVM.

In S104, using the circuit in the monitoring IC, the assembled-battery voltage detection device checks whether any one of the voltages at the single batteries V1 to Vn detected by the single-battery voltage detection circuits CD1 to CDn in S100 is less than or equal to 0 V. When no single battery has the voltage of 0 V, namely, when all the single batteries V1 to Vn are normal, the assembled-battery voltage detection device ends the processing with doing nothing. On the other hand, when any one of the voltages at the single batteries V1 to Vn is less than or equal to 0 V, the following steps are performed.

In S106, using the circuit in the monitoring IC, the end-battery voltage abnormality determination unit of the assembled-battery voltage detection device checks whether one of the voltages at the lowest-order and highest-order single batteries V1 and Vn detected by the single-battery voltage detection circuits CD1 and CDn in S100 is less than or equal to 0 V, and the end-battery voltage abnormality determination unit determines whether the voltage at the single battery V1 or Vn is 0. When the voltages at the lowest-order and highest-order single batteries V1 and Vn are not 0 V, namely, when the voltage at any one of the single batteries V2 to Vn-1 located between the single batteries V1 and Vn is 0 V, the assembled-battery voltage detection device performs a method for controlling the single batteries located at intermediate positions in S112. The method for controlling the single batteries located at the intermediate positions is well known, but there is no particular limitation to the method.

When one of the voltages at the single batteries V1 and Vn is 0 V, the single battery voltage sum calculator of the assembled-battery voltage detection device calculates the sum σ of the voltages detected by the single-battery voltage detection circuits CD1 to CDn in S108. In S108, the assembled-battery voltage detection device checks whether the voltage sum σ agrees with the potential difference δ that is detected by the assembled-battery voltage detection circuit MD in S102.

As a result of the check in S108, the abnormality output unit of the assembled-battery voltage detection device outputs the disconnection abnormality in S110 when the voltage sum σ does not agree with the potential difference δ, and the abnormality output unit outputs the short-circuit abnormality in S114 when the voltage sum σ agrees with the potential difference δ. As described above, during the normal operation, the highest-order and lowest-order single batteries Vn and V1 exhibit the voltage of the normal value, the sum σ is equal to the potential difference δ, and the difference between the sum σ and the potential difference δ is 0 V. That is, in the case that the sum σ is equal to the potential difference δ while the highest-order and lowest-order single batteries Vn and V1 exhibit the voltage of the normal value, the assembled battery is normal at the ends, but the abnormality is not particularly generated.

On the other hand, in the case that the sum σ of the detected voltages at the single batteries does not agree with the detected voltage (potential difference δ) at the assembled battery MO while the detected voltage at the highest-order single battery is 0 V, the abnormality output unit determines that the disconnection is generated in the highest-order voltage detection line in S110.

In the case that the sum σ of the detected voltages at the single batteries does not agree with the detected voltage (potential difference δ) at the assembled battery MO while the detected voltage at the lowest-order single battery is 0 V, the abnormality output unit determines that the disconnection is generated in the lowest-order voltage detection line in S110.

In the case that the sum σ of the detected voltages at the single batteries agrees with the detected voltage (potential difference δ) at the assembled battery MO while the detected voltage at the highest-order single battery is 0 V, the abnormality output unit determines that the short-circuit is generated in the highest-order single battery Vn in S114.

In the case that the sum σ of the detected voltages at the single batteries agrees with the detected voltage (potential difference δ) at the assembled battery MO while the detected voltage at the lowest-order single battery is 0 V, the abnormality output unit determines that the short-circuit is generated in the lowest-order single battery V1 in S114.

As described above, one or more embodiments of the disclosure can provide the assembled-battery voltage detection device that, in the assembled battery formed by the series connection of the plurality of single batteries, detects the disconnection of the voltage detection line at each of both the end of the assembled battery and the short circuit of the single battery while distinguishing the disconnection and the short circuit from each other. In the case that the assembled-battery voltage detection device is used in vehicles such as an automobile, a response varies depending on whether the disconnection or short circuit is generated in the assembled battery. For example, the vehicle can continue to run in the case that the disconnection is generated in the assembled battery. On the other hand, in the case that the short circuit is generated, an emergency response is required such that the vehicle is stopped. Accordingly, it is necessary that the disconnection and the short circuit be detected in the assembled battery while distinguished from each other.

The disclosure is not limited to the embodiment, but may have various configurations without departing from the scope of the claims. That is, the invention is particularly illustrated and described with reference to a specific embodiment, those skilled in the art can make various modifications in quantities and other detailed configurations of the embodiment without departing from the scope of technical thought and purpose of the invention.

The invention claimed is:

1. An assembled-battery voltage detection device comprising:
   a plurality of single-battery voltage detection circuits configured to detect a voltage at each single battery of an assembled battery in which a plurality of single batteries are connected in series;
   single-battery voltage detection terminals that are provided in the single-battery voltage detection circuits and connected to ends of the single batteries;
   connectors configured to connect the single-battery voltage detection terminals and the single batteries;
   a first voltage detection terminal configured to detect a voltage at a first single battery of the plurality of single batteries located at a first end in the assembled battery through a first connector;
   a second voltage detection terminal configured to detect a voltage at a second single battery of the plurality of single batteries located at a second end in the assembled battery through a second connector;
   an assembled-battery voltage detection circuit configured to detect a potential difference between the first voltage detection terminal and the second voltage detection terminal;
   a single-battery voltage sum calculator configured to calculate a sum of the voltages detected by the plurality of single-battery voltage detection circuits;
   an end-battery voltage abnormality determination unit configured to determine whether the voltages at the first single battery and second single battery located respectively at the first end and second end are 0 V, the voltages at the plurality of single batteries being detected by the plurality of single-battery voltage detection circuits; and an abnormality output unit configured to, when the end-battery voltage abnormality determination unit determines that the voltages at the first single battery and second single battery respectively located at the first end and second end are 0 V, output a disconnection abnormality signal when the voltage sum calculated by the single-battery voltage sum calculator does not agree with the potential difference detected by the assembled-battery voltage detection circuit, and output a short-circuit abnormality signal when the voltage sum agrees with the potential difference, wherein the first end and the second end are located at opposite sides of the assembled-battery voltage detection device.

* * * * *